United States Patent
Li et al.

(10) Patent No.: US 11,329,170 B2
(45) Date of Patent: May 10, 2022

(54) SEMICONDUCTOR DEVICE HAVING A LATERAL SEMICONDUCTOR HETEROJUNCTION AND METHOD

(71) Applicant: KING ABDULLAH UNIVERSITY OF SCIENCE AND TECHNOLOGY, Thuwal (SA)

(72) Inventors: Ming-Yang Li, Thuwal (SA); Jing-Kai Huang, Thuwal (SA); Lain-Jong Li, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 17/134,984

(22) Filed: Dec. 28, 2020

(65) Prior Publication Data
US 2021/0119060 A1    Apr. 22, 2021

Related U.S. Application Data

(62) Division of application No. 16/754,214, filed as application No. PCT/IB2018/057266 on Sep. 20, 2018, now Pat. No. 10,998,452.

(Continued)

(51) Int. Cl.
*H01L 29/861* (2006.01)
*H01L 21/02* (2006.01)
(Continued)

(52) U.S. Cl.
CPC ...... *H01L 29/8611* (2013.01); *H01L 21/0262* (2013.01); *H01L 21/02568* (2013.01); *H01L 29/24* (2013.01); *H01L 29/66969* (2013.01)

(58) Field of Classification Search
CPC .......... H01L 21/02557; H01L 21/0256; H01L 21/02562; H01L 21/02568; H01L 21/0262;
(Continued)

(56) References Cited

U.S. PATENT DOCUMENTS 6,165,264 A    12/2000 Makita et al.
8,778,782 B2    7/2014 Lippert et al.
(Continued)

OTHER PUBLICATIONS

International Search Report in corresponding/related International Application No. PCT/IB2018/057266, dated Dec. 19, 2018.
(Continued)

*Primary Examiner* — Cheung Lee
(74) *Attorney, Agent, or Firm* — Patent Portfolio Builders PLLC

(57) ABSTRACT

A method for forming a semiconductor device having a lateral semiconductor heterojunction involves forming a first metal chalcogenide layer of the lateral semiconductor heterojunction adjacent to a first metal electrode on a substrate. The first metal chalcogenide layer includes a same metal as the first metal electrode and at least some of the first metal chalcogenide layer includes metal from the first metal electrode. A second metal chalcogenide layer of the lateral semiconductor heterojunction is formed adjacent to the first metal chalcogenide layer. A second metal electrode is formed adjacent to the second metal chalcogenide layer. The second metal chalcogenide layer includes a same metal as the second metal electrode.

6 Claims, 5 Drawing Sheets

Related U.S. Application Data

(60) Provisional application No. 62/620,161, filed on Jan. 22, 2018, provisional application No. 62/573,234, filed on Oct. 17, 2017.

(51) Int. Cl.
*H01L 29/24* (2006.01)
*H01L 29/66* (2006.01)

(58) Field of Classification Search
CPC ....... H01L 29/24; H01L 29/401; H01L 29/41; H01L 29/66007; H01L 29/66969; H01L 29/861; H01L 31/0256; H01L 31/0272; H01L 31/032; H01L 31/0324; H01L 45/06; H01L 45/12; H01L 45/1253; H01L 45/14; H01L 45/141; H01L 45/142; H01L 45/143; H01L 45/144; H01L 45/1608; C01B 17/20; C01B 17/42; C01B 19/00; C01B 19/04
See application file for complete search history.

(56) References Cited

U.S. PATENT DOCUMENTS

| | | | |
|---|---|---|---|
| 9,620,665 | B1 | 4/2017 | Bartolucci et al. |
| 2012/0073622 | A1 | 3/2012 | Yang et al. |
| 2012/0088039 | A1 | 4/2012 | Yu et al. |
| 2014/0245946 | A1 | 9/2014 | Kong et al. |
| 2015/0122314 | A1 | 5/2015 | Snaith et al. |
| 2017/0110564 | A1* | 4/2017 | Kim ................. H01L 29/66037 |
| 2017/0170260 | A1 | 6/2017 | Dresselhaus et al. |

OTHER PUBLICATIONS

Ji, Q., et al., "Chemcial Vapour Deposition of Group-VIB Metal Dichalcogenide Monolayers: Engineered Substrates from Amorphous to Single Crystalline," Chemical Society Reviews, Jan. 1, 2015, vol. 44, No. 9, pp. 2587-2602, Royal Society of Chemistry.

Kang, J., et al., "Computational Study of Metal Contacts to Monolayer Transition-Metal Dichalcogenide Semiconductors," Physical Review X, Jul. 1, 2014, vol. 4, No. 3, pp. 031005-1-031005-14, American Physical Society.

Li, M.-Y., et al., "Epitaxial Growth of a Monolayer WSe2—MoS2 Lateral p-n Junction with an Atomically Sharp Interface," Science, Jul. 31, 2015, vol. 349, No. 6247, pp. 524-528.

Li, M.-Y., et al., "Heterostructures Based on Two-Dimensional Layered Materials and Their Potential Applications," Materials Today, Jul./Aug. 2016, vol. 19, No. 6, pp. 322-335, Elsevier Ltd.

Li, M.-Y., et al., "Self-Aligned and Scalable Growth of Monolayer WSe2—MoS2 Lateral Heterojunctions," Advanced Functional Materials, Apr. 1, 2018, vol. 28, No. 17, pp. 1706860 (7 pages), WILEY-VCH Verlag Gmbh & Co.

Tai, G., et al., "Fast and Large-Area Growth of Uniform MoS2 Monolayers on Molybdenum Foils," Nanoscale, Jan. 1, 2016, vol. 8, No. 4, pp. 2234-2241, Royal Society of Chemistry.

Tsai, H.-S., "Vertical Al2Se3/MoSe2 Heterojunction on Sapphire Synthesized Using Ion Beam," RSC Advances, Jan. 1, 2017, vol. 7, No. 17, pp. 10154-10157, Royal Society of Chemistry.

Written Opinion of the International Searching Authority in corresponding/related International Application No. PCT/IB2018/057266, dated Dec. 19, 2018.

Yoo, Y., et al., "Seed Crystal Homogeneity Controls Lateral and Vertical Heteroepitaxy of Monolayer MoS2 and WS2," Journal of the American Chemical Society, Nov. 18, 2015, vol. 137, No. 45, pp. 14281-14287, American Chemical Society.

\* cited by examiner

FIG. 2
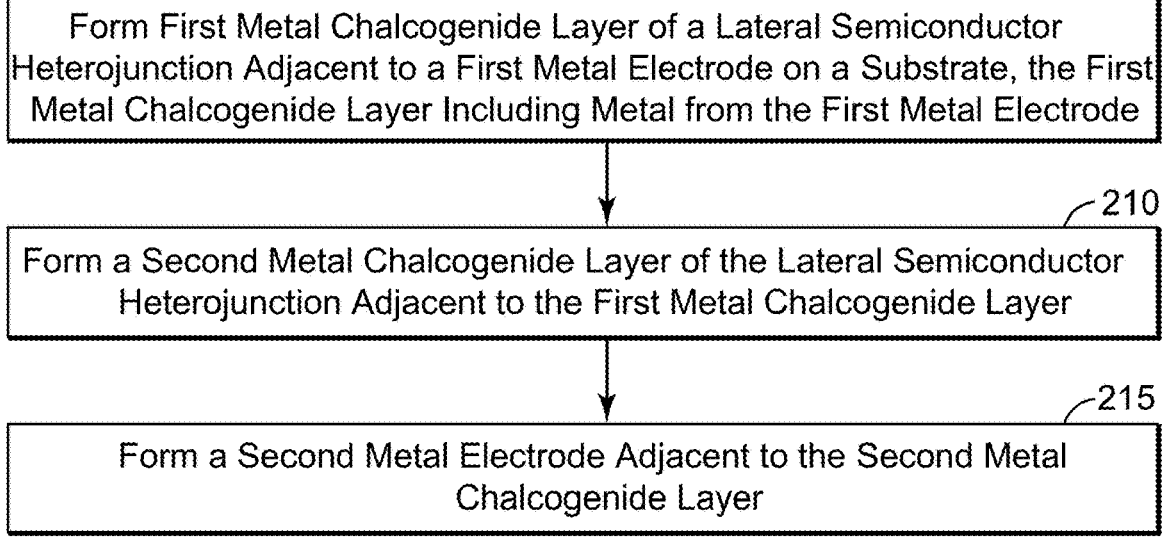
FIG. 3A1
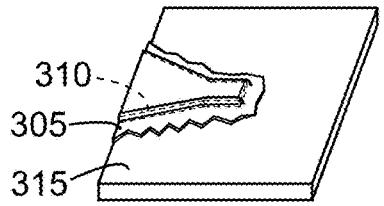
FIG. 3A2
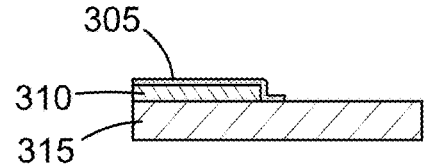
FIG. 3B1
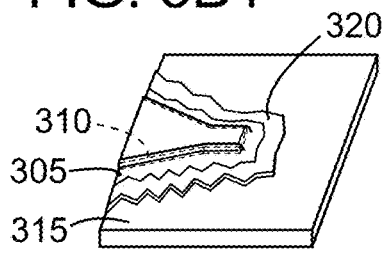
FIG. 3B2
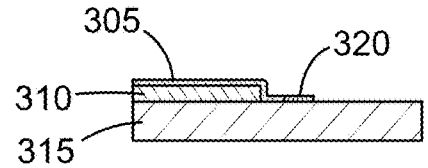
FIG. 3C1
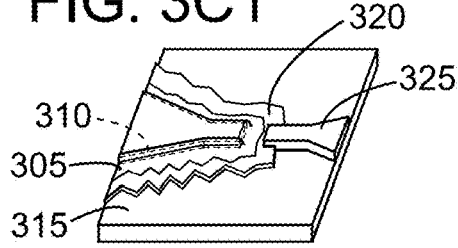
FIG. 3C2
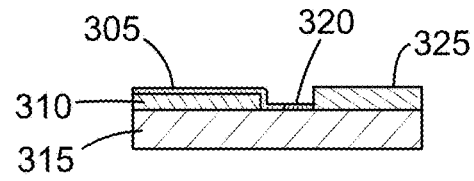

SEMICONDUCTOR DEVICE HAVING A LATERAL SEMICONDUCTOR HETEROJUNCTION AND METHOD

CROSS-REFERENCE TO RELATED APPLICATIONS

This application is a Divisional Application of U.S. application Ser. No. 16/754,214, filed Apr. 7, 2020, which is a U.S. National Stage Application of International Application No. PCT/IB2018/057266, filed on Sep. 20, 2018, which claims priority to U.S. Provisional Patent Application No. 62/573,234, filed on Oct. 17, 2017, entitled "METHOD TO GROWTH SCALABLE SELF-ALIGNED TWO-DIMENSIONAL HETEROJECTION DEVICES," and to U.S. Provisional Patent Application No. 62/620,161, filed on Jan. 22, 2018, entitled "SEMICONDUCTOR DEVICE HAVING A LATERAL SEMICONDUCTOR HETEROJUNCTION AND METHOD," the disclosures of which are incorporated herein by reference in their entirety.

BACKGROUND

Technical Field

Embodiments of the disclosed subject matter generally relate to a method for forming a semiconductor device having a lateral semiconductor heterojunction, a diode including a lateral semiconductor heterojunction, and method of forming a semiconductor device.

Discussion of the Background

Two-dimensional (2D) transition metal dichalcogenide (TMD) layered materials, such as those with molybdenum disulphide ($MoS_2$) layers, have been recognized as high on-off ratio semiconductors, which are promising for high-quantum yield optoelectronics, next-generation transistors and integrated circuit applications. One problem with conventional transition metal dichalcogenide growth techniques is that there is little control over the growth location. For example, referring now to FIG. 1, in one conventional technique sulfur (S) 102 and transition metal 104 powders are arranged in a chemical vapor deposition chamber 106. Gas 108 is provided to the chemical vapor deposition chamber 106, which causes the sulfur 102 and transition metal 104 powders to flow to a substrate 110 on which the transition metal dichalcogenide layer 112 is grown while the chemical vapor deposition chamber 106 is heated. Specifically, in the illustrated example the transition metal is molybdenum (Mo), which is oxidized to form molybdenum trioxide ($MoO_3$), which then combines with the sulfur to form a molybdenum disulfide ($MoS_2$) layer 112.

Although this conventional technique results in a transition metal dichalcogenide layer 112 being formed on the substrate 110, there is little control over where on the substrate the layer 112 is grown. This can be problematic for the formation of p-n junctions between two different transition metal dichalcogenide monolayers. Devices with p-n junctions between two different transition metal dichalcogenide monolayers are desirable because they enable device functionalities, including current rectifying, light emitting and photon harvesting.

One technique for achieving location selective growth to form a lateral heterojunction involves a combination of chemical vapor deposition and photolithography. Specifically, a first layer is grown on a substrate using chemical vapor deposition and then the substrate is removed from a chemical vapor deposition chamber to pattern the first layer using photolithography and reactive ion etching. The substrate is then placed in the chemical vapor deposition chamber to grow the second layer. The first and second metal electrodes are then formed on the substrate.

The patterning by photolithography and reactive ion etching degrades the quality of the materials in the first layer and results in a poor interface between the two layers, whereas an atomic sharp interface between two lateral layers of a heterojunction has been shown to be advantageous for the performance of the resulting semiconductor device having the lateral heterojunction. Further, the photolithography and reactive ion etching require the use of photoresists, which result in unavoidable residues remaining on the substrate when the second layer is grown. These residues act as growth seeds while growing the second layer, which induce uncontrollable growth.

Thus, it would be desirable to provide for forming a lateral heterojunction in a location-selective manner that provides an atomic sharp interface between the two lateral layers.

SUMMARY

According to an embodiment, there is a method for forming a semiconductor device having a lateral semiconductor heterojunction. A first metal chalcogenide layer of the lateral semiconductor heterojunction is formed adjacent to a first metal electrode on a substrate. The first metal chalcogenide layer includes a same metal as the first metal electrode and at least some of the first metal chalcogenide layer includes metal from the first metal electrode. A second metal chalcogenide layer of the lateral semiconductor heterojunction is formed adjacent to the first metal chalcogenide layer. A second metal electrode is formed adjacent to the second metal chalcogenide layer. The second metal chalcogenide layer includes a same metal as the second metal electrode.

According to another embodiment, there is a diode, which includes a substrate, a first electrode arranged on the substrate and comprising a first metal, a second electrode arranged on the substrate and comprising a second metal, and a lateral semiconductor heterojunction on the substrate between the first and second electrodes. The lateral semiconductor heterojunction comprises laterally arranged first and second layers and the first layer includes the first metal and the second layer includes the second metal. A portion of the first layer covers a portion of a top surface of the first electrode.

According to a further embodiment, there is a method for forming a semiconductor device with a lateral semiconductor heterojunction. A first metal powder and a first chalcogen powder are arranged upstream of a substrate in a chemical vapor deposition chamber. The substrate has a first metal electrode, and the first metal electrode and the first metal powder include a same metal. The chemical vapor deposition chamber is heated while feeding a carrier gas into the chemical vapor deposition chamber to grow a first metal chalcogenide layer that follows a geometry of the first metal electrode. The first metal chalcogenide layer includes metal from the first metal electrode and from the first metal powder. A second metal powder and a second chalcogen powder are arranged upstream of the substrate in the chemical vapor deposition chamber. The chemical vapor deposition chamber is heated while feeding the carrier gas into the chemical vapor deposition chamber to grow a second metal chalcogenide layer that follows a geometry of the first metal chalcogenide layer to form the lateral semiconductor heterojunction.

BRIEF DESCRIPTION OF THE DRAWINGS

The accompanying drawings, which are incorporated in and constitute a part of the specification, illustrate one or more embodiments and, together with the description, explain these embodiments. In the drawings:

FIG. 2 is a flowchart of a method of forming a lateral semiconductor heterojunction according to an embodiment;

FIGS. 3A1-3C2 are schematic diagrams of a method of forming a lateral semiconductor heterojunction according to an embodiment;

DETAILED DESCRIPTION

Figure 1:
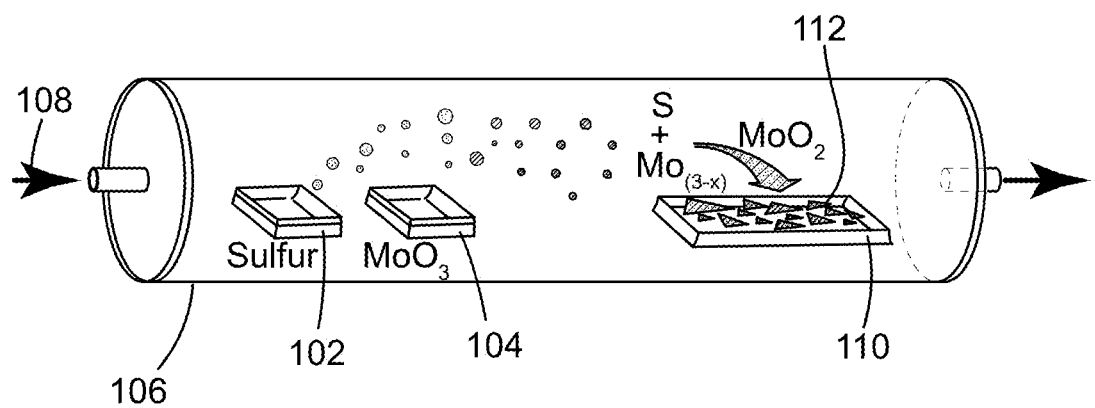
FIG. 1 is a schematic diagram of conventional method for growing a transition metal dichalcogenide layer.

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of metal chalcogenide layer growth techniques.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

A method of forming a lateral semiconductor heterojunction will now be described in connection with FIGS. 2 and 3A1-3C2, which in the illustrated embodiment is a diode. Initially, a first metal chalcogenide layer 305 of the lateral semiconductor heterojunction is formed adjacent to a first metal electrode 310 on a substrate 315 (step 205 and FIGS. 3A1 and 3A2). The first metal chalcogenide layer 305 includes the same metal as the first metal electrode 310 and at least some of the first metal chalcogenide layer 305 includes metal from the first electrode 310. Next, a second metal chalcogenide layer 320 of the lateral semiconductor heterojunction is formed adjacent to the first metal chalcogenide layer 305 (step 210 and FIGS. 3B1 and 3B2). Finally, a second metal electrode 325 is formed adjacent to the second metal chalcogenide layer 320 (step 215 and FIGS. 3C1 and 3C2). The second metal chalcogenide layer 320 includes a same metal as the second metal electrode 325.

The inventors have recognized that by using the same metal for the first metal electrode 310 and the first metal chalcogenide layer 305 results in the first metal chalcogenide layer 305 following the geometry of the first metal electrode 310 because the metal of the first metal electrode 310 acts as a catalyst to facilitate growth of the first metal chalcogenide layer 305. This advantageously provides location-selective growth of the first metal chalcogenide layer 305. As illustrated in FIGS. 3A1-3C2, this also results in at least a portion of the first metal chalcogenide layer 305 covering the top surface of the first metal electrode 310. Covering the top surface of the first metal electrode 310 does not affect device functionality because the underlying first metal electrode will have sufficient thickness to ensure transport through the portion of the first metal chalcogenide layer 305 covering the first metal electrode 310.

Further, as illustrated in FIGS. 3B1, 3B2, 3C1, and 3C2, the second metal chalcogenide layer 320 is epitaxially formed from the edge of the first metal chalcogenide layer 305, which provides an atomically sharp interface between the first 305 and second 320 metal chalcogenide layers, which provides better performance of the device having the heterojunction compared to conventional techniques that use lithography to form the heterojunction.

Figure 4:
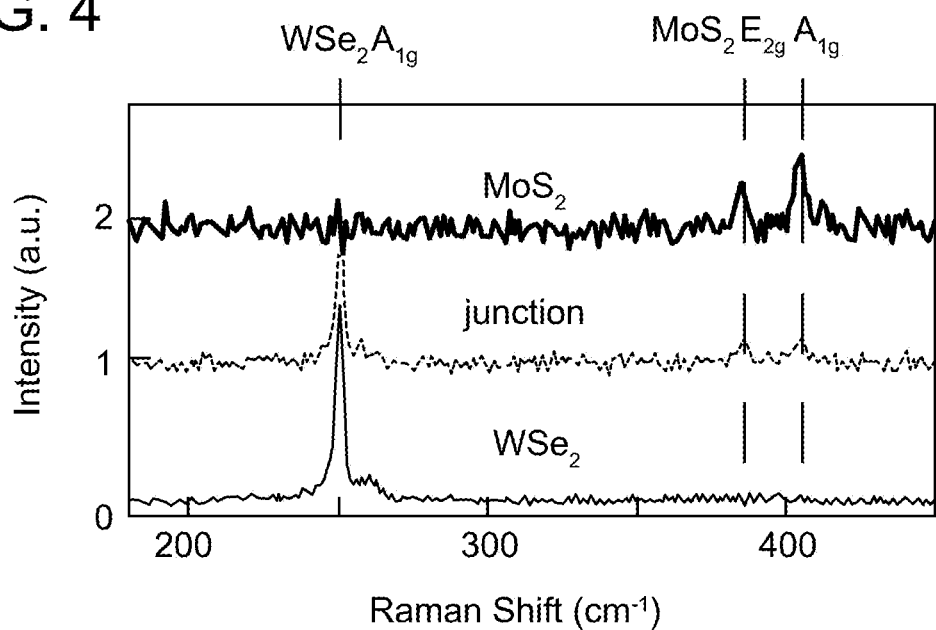
FIG. 4 is a graph of the Raman spectra taken along a lateral semiconductor heterojunction formed according to an embodiment.

The atomically sharp interface of the heterojunction was confirmed by Raman spectra measurements of a lateral semiconductor heterojunction formed in the manner disclosed herein. Specifically, FIG. 4 illustrates Raman spectra measurements of a lateral semiconductor heterojunction in which one layer is tungsten diselenide ($WSe_2$) and the other layer is molybdenum disulfide ($MoS_2$). In the areas only having tungsten diselenide (i.e., the lowest plot in FIG. 4) or only having molybdenum disulfide (i.e., the top-most plot in FIG. 4), characteristic peaks were found at about 250 $cm^{-1}$ ($A_{1g}$ mode), 405 $cm^{-1}$ ($A_{1g}$ mode), and 385 cm-1 ($E_{2g}$ mode). Further, the interface between the molybdenum disulfide layer and the molybdenum disulfide (i.e., the middle plot in FIG. 4) shows molybdenum disulfide and the molybdenum disulfide coexisting without the formation of an alloy. Thus, there is no intervening material, such as an alloy, between the tungsten diselenide and molybdenum disulfide layers.

Figure 5A:
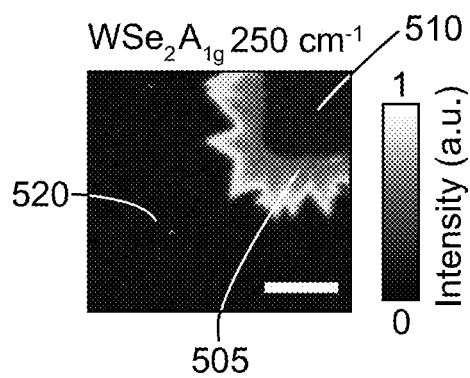
FIGS. 5A and 5B are intensity mappings of Raman spectrum for, respectively, a tungsten diselenide layer and a molybdenum disulfide layer according to an embodiment.
Figure 5B:
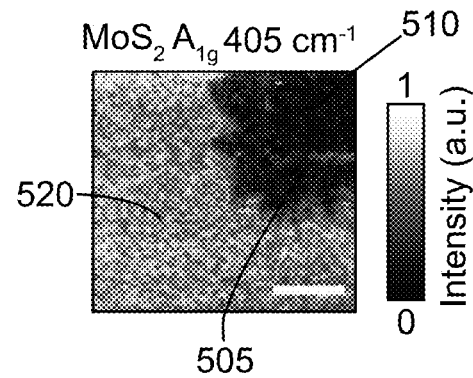
Figure 5C:
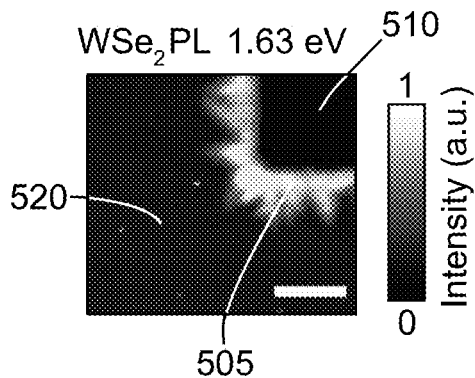
FIGS. 5C and 5D are intensity mappings of photoluminescence spectrum for, respectively, a tungsten diselenide layer and a molybdenum disulfide layer according to an embodiment.
Figure 5D:
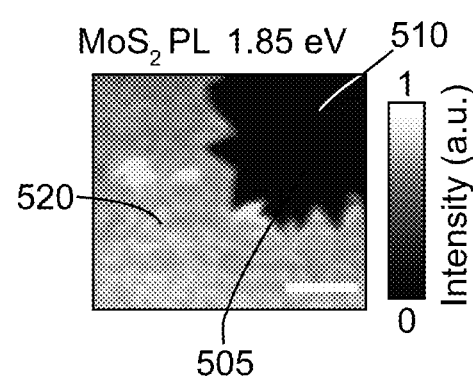
Figure 6:
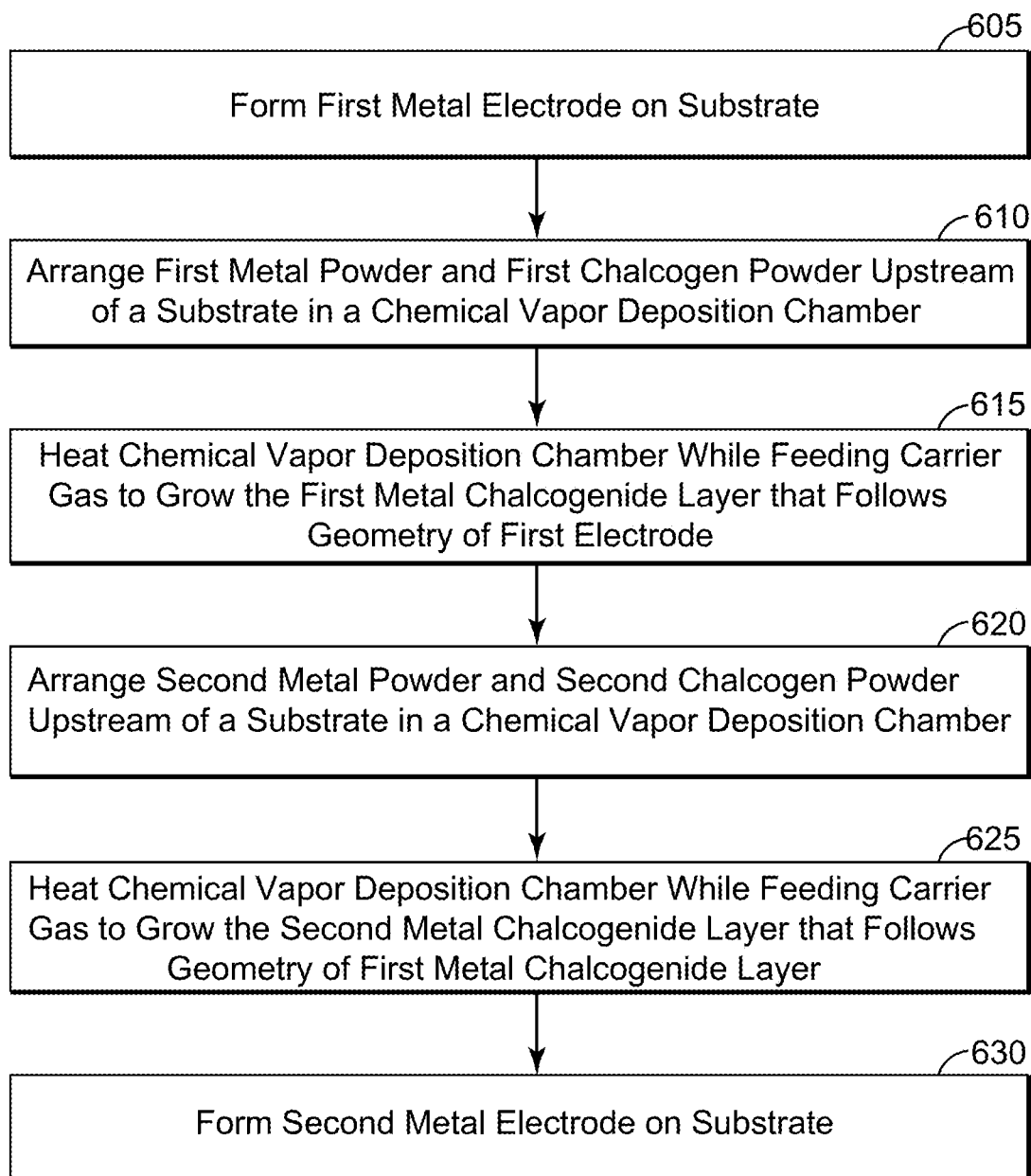
FIG. 6 is a flowchart of a method of forming a lateral semiconductor heterojunction according to an embodiment.

The atomically sharp interface of the heterojunction was also confirmed by Raman and photoluminescence intensity mapping a lateral semiconductor heterojunction formed in the manner disclosed herein with one layer being tungsten diselenide and the other layer is molybdenum disulfide. Specifically, FIGS. 5A and 5B are intensity mappings of Raman spectrum for, respectively, a tungsten diselenide layer and a molybdenum disulfide layer, and FIGS. 5C and 5D are intensity mappings of photoluminescence spectrum for, respectively, a tungsten diselenide layer and a molybdenum disulfide layer according to an embodiment. FIGS. 5A-5D each illustrate a tungsten electrode 510, tungsten diselenide layer 505, and molybdenum disulfide layer 520. As illustrated in FIGS. 5A and 5C, the growth of the tungsten diselenide layer 505 follows the geometry of the tungsten electrode 510 and exhibits high selectivity in growth location compared with a sapphire basal plane of the substrate (not illustrated). Further, as illustrated in FIGS. 5A-5D, the tungsten diselenide layer 505 and molybdenum disulfide layer 520 are well separated without an alloy being formed at the lateral junction of these two layers.

A method for forming a semiconductor device with a lateral heterojunction using chemical vapor deposition will now be described in connection with FIGS. 6 and 7A-7E. An embodiment of the method will be described in connection with the formation of a tungsten diselenide-molybdenum sulfide heterojunction device. However, heterojunctions using other metals and chalcogens disclosed herein can be formed using this method.

Figure 7A:
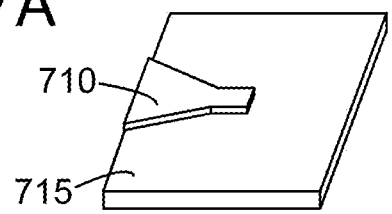
FIGS. 7A-7E are schematic diagrams of a method of forming a lateral semiconductor heterojunction according to an embodiment.

Initially, a first metal electrode 710 is formed on a substrate 715 (step 605 and FIG. 7A). In this embodiment, the first metal electrode 710 is formed outside of a chemical vapor deposition chamber, for example by forming a 50 nm thick tungsten electrode on a sapphire substrate by physical vapor sputtering, which is followed by photolithography patterning. The substrate 715, including the first metal electrode 710, can then be cleaned, for example, using acetone and ultra-sonification for five minutes to clean the surface for increasing growth selection. The first metal electrode 710 can be formed in any desired geometry, which can be regular (i.e., corresponding to a geometric shape) or irregular (i.e., not corresponding to a geometric shape). The ability to select the geometry of the first metal electrode 710

Figure 7B:
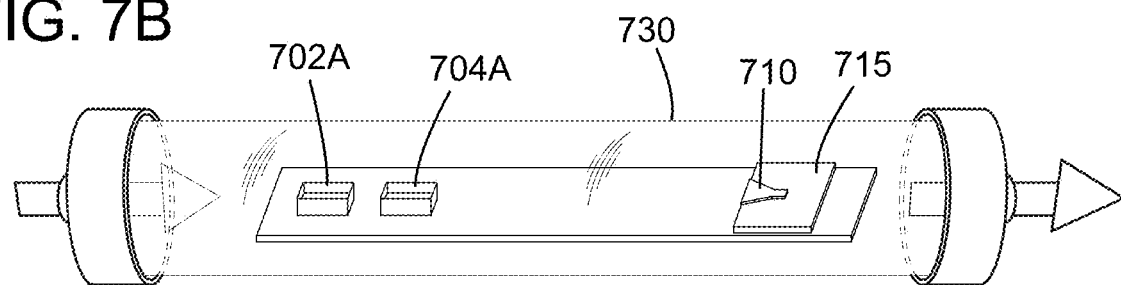

A first metal powder 702A and first chalcogen powder 704A are arranged upstream of the substrate 715 in a chemical vapor deposition chamber 730 (step 610 and FIG. 7B). In this embodiment, the first metal powder 702A is a tungsten trioxide powder and the first chalcogen powder 704A is selenium. The chemical vapor deposition chamber 730 can be maintained at a temperature of, for example, 250° C. while the powders 702A and 704A are placed in the chemical vapor deposition chamber 730.

Figure 7C:
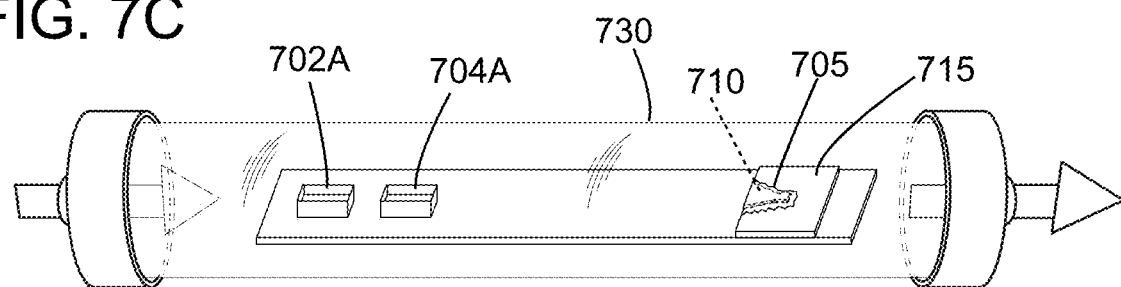

The chemical vapor deposition chamber 730 is heated while carrier gas is fed into the chemical vapor deposition chamber 730 to grow the first metal chalcogenide layer 705 that follows the geometry of the first electrode 710 (step 615 and FIG. 7C). In this embodiment, the chemical vapor deposition chamber 730 can be heated to, for example, 850° C. for 15 minutes while an argon/hydrogen (Ar/$H_2$) carrier gas (65 sccm/5 sccm) is fed into the chemical vapor deposition chamber 730, which is held at a pressure of 20 Torr. The growth of the tungsten diselenide layer 705 follows the geometry of the first metal electrode 710 through selenization on the tungsten metal surface of the first metal electrode 710, as well as through epitaxial growth from the tungsten metal edge of the first metal electrode 710 onto the basal plane of the sapphire substrate 715. Thus, the disclosed method provides for location-selective growth of the first layer. Further, chemical vapor deposition process causes the tungsten diselenide layer 705 to include some metal from the first metal electrode 710.

Figure 7D:
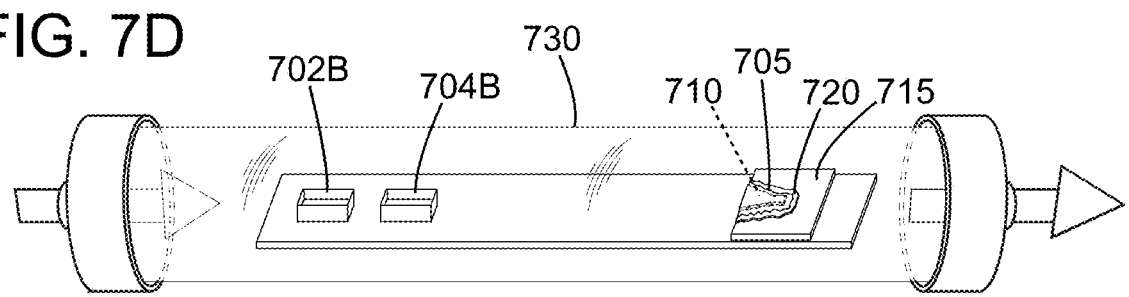

A second metal powder 702B and second chalcogen powder 704B are arranged upstream of the substrate 715 in the chemical vapor deposition chamber 730 (step 620 and FIG. 7D). In this embodiment, the second metal powder 702B is molybdenum trioxide and the second chalcogen powder 704B is sulfur. This can be performed in the same chemical vapor deposition chamber as the previous steps or a different chemical vapor deposition chamber. Using a different chemical vapor deposition chamber is advantageous because there will be some residues or byproduct coating the chamber after growing the tungsten diselenide layer 705. However, the same chemical vapor deposition chamber can be used so long as these residues or byproducts are cleaned from the chemical vapor deposition chamber used to grow the tungsten diselenide layer 705.

The chemical vapor deposition chamber 730 is heated while a carrier gas is fed into the chemical vapor deposition chamber 730 to grow the second metal chalcogenide layer 720 that follows the geometry of the first metal chalcogenide layer (step 625 and FIG. 7D). In this embodiment, the chemical vapor deposition chamber 730 can be heated to, for example, 750° C. for 10 minutes while an argon carrier gas (60 sccm) is fed into the chemical vapor deposition chamber 730, which is held at a pressure of 50 Torr. The molybdenum disulfide layer epitaxially grows from the edge of the tungsten diselenide layer, follows the geometry of the tungsten diselenide layer, and forms an atomic sharp interface between the two layers. In contrast, conventional layer heterojunctions are typically formed using etching, which does not provide an atomic sharp interface between the layers, and thus results in reduced device performance compared to layer heterojunctions formed in the manner disclosed. In other words, an atomic sharp interface can be achieved by forming the heterojunction without etching the first metal chalcogenide layer.

Figure 7E:
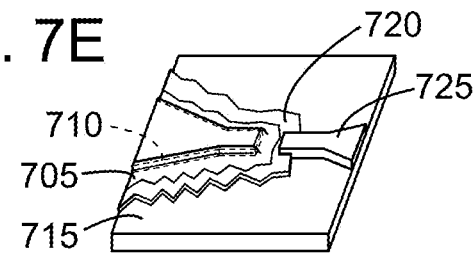

Finally, the second electrode 725 is then formed on substrate 725 (step 630 and FIG. 7E). In this embodiment, the second metal electrode 725 is formed outside of the chemical vapor deposition chamber 730, for example by forming a 5 nm/25 nm thick molybdenum/nickel electrode on the sapphire substrate 715 by physical vapor sputtering, which is followed by photolithography patterning.

Thus, as will be appreciated from the discussion above, the first metal chalcogenide layer 705 and the first electrode 710 include the same metal (tungsten in this example), and the second metal chalcogenide layer 720 and second electrode 725 include the same metal (molybdenum in this example).

Although embodiments have been described in which the heterojunction is formed using tungsten trioxide and molybdenum trioxide as the precursor metals and selenium and sulfur as the chalcogen precursors, other metals and chalcogen precursors can be used. For example, the metal precursor can be tungsten oxide ($WO_2$), tungsten oxytetrachloride ($WOCl_4$), tungsten hexacarbonyl (($W(CO)_6$), molybdenum oxide ($MoO_2$), molybdenum chloride ($MoCl_5$), molybdenum hexcarbonyl (($Mo(CO)_6$), bismuth telluride ($Bi2Te_3$), bismuth selenide ($Bi_2Se_3$), bismuth oxide selenium ($Bi_2O_2Se$), indium selenide (InSe), or gallium selenium (GaSe). Further, the chalcogen can be hydrogen selenium ($H_2Se$), hydrogen sulfide ($H_2S$), dimethyl selenium (DMSe), dimethyl diselenide (DMDSe), dimethyl sulfide (DMS), or dimethyl disulfide (DMDS).

The disclosed embodiments provide a method for forming a semiconductor device having a lateral semiconductor heterojunction, a diode including a lateral semiconductor heterojunction, and method of forming a semiconductor device. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A diode, comprising:
    a substrate;
    a first electrode arranged on the substrate and comprising a first metal;
    a second electrode arranged on the substrate and comprising a second metal;
    a lateral semiconductor heterojunction on the substrate between the first and second electrodes, wherein the lateral semiconductor heterojunction comprises laterally arranged first and second layers, and wherein the first layer includes the first metal and the second layer includes the second metal,
    wherein a portion of the first layer covers a portion of a top surface of the first electrode.

2. The diode of claim 1, wherein the first electrode directly adjoins the substrate without any intervening material of the first or second layer.

3. The diode of claim 1, wherein at least a portion of the first metal in the first layer includes the first metal from the first electrode.

4. The diode of claim 1, wherein the heterojunction includes an atomically sharp interface between the first and second layers.

5. The diode of claim 1, wherein the first and second layers are metal chalcogenide layers.

6. The diode of claim 5, wherein the first or second metal chalcogenide layer is formed from
    a metal selected from a group consisting of tungsten oxide, tungsten trioxide, tungsten oxytetrachloride, tungsten hexacarbonyl, molybdenum oxide, molybdenum trioxide, molybdenum chloride, molybdenum hexcarbonyl, bismuth telluride, bismuth selenide, bismuth oxide selenium, indium selenide, and gallium selenium; and
    a chalcogen selected from a group consisting of selenium, hydrogen selenium, sulfide, hydrogen sulfide, dimethyl selenium, dimethyl diselenide, dimethyl sulfide, and dimethyl disulfide.

* * * * *